United States Patent
Sprouse et al.

(10) Patent No.: US 10,127,150 B2
(45) Date of Patent: Nov. 13, 2018

(54) KEY VALUE ADDRESSED STORAGE DRIVE USING NAND FLASH BASED CONTENT ADDRESSABLE MEMORY

(71) Applicant: SanDisk Technologies LLC, Plano, TX (US)

(72) Inventors: Steven T. Sprouse, San Jose, CA (US); Yan Li, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 13/749,523

(22) Filed: Jan. 24, 2013

(65) Prior Publication Data

US 2014/0136758 A1    May 15, 2014

Related U.S. Application Data

(60) Provisional application No. 61/724,401, filed on Nov. 9, 2012, provisional application No. 61/730,884, filed on Nov. 28, 2012.

(51) Int. Cl.
*G06F 12/00* (2006.01)
*G06F 12/02* (2006.01)
(Continued)

(52) U.S. Cl.
CPC ...... *G06F 12/0246* (2013.01); *G11C 11/5642* (2013.01); *G11C 15/046* (2013.01);
(Continued)

(58) Field of Classification Search
CPC ............. G06F 12/0246; G06F 12/0864; G06F 17/30982; G11C 15/046; G11C 16/0483; G11C 2211/5642
See application file for complete search history.

(56) References Cited

U.S. PATENT DOCUMENTS 4,780,624 A    10/1988    Nicollini et al.
4,912,427 A    3/1990    Rybicki
(Continued)

FOREIGN PATENT DOCUMENTS

EP    1720168    11/2006
EP    1988474    11/2008
WO    WO 2011/007304    1/2011

OTHER PUBLICATIONS

Black, Jr., et al., "A High Performance Low Power CMOS Channel Filter," IEEE Journal of Solid-State Circuits, vol. SC-15, No. 6, Dec. 1980, pp. 929-938.
(Continued)

*Primary Examiner* — David Yi
*Assistant Examiner* — Alan Otto
(74) *Attorney, Agent, or Firm* — Stoel Rives LLP

(57) ABSTRACT

A NAND Flash based content addressable memory (CAM) is used for a key-value addressed storage drive. The device can use a standard transport protocol such as PCI-E, SAS, SATA, eMMC, SCSI, and so on. A host writes a key-value pair to the drive, where the drive writes the keys along bit lines of a CAM NAND portion of the drive and stores the value in the drive. The drive then maintains a table linking the keys to location of the value. In a read process, the host provides a key to drive, which then broadcasts down the word lines of blocks storing the keys. Based on any matching bit lines, the tables can then be used to retrieve and supply the corresponding data to the host.

24 Claims, 12 Drawing Sheets

(51) Int. Cl.
| | | |
|---|---|---|
| *G11C 11/56* | (2006.01) | |
| *G11C 15/04* | (2006.01) | |
| *G11C 16/04* | (2006.01) | |
| *G11C 16/34* | (2006.01) | |
| *G11C 16/02* | (2006.01) | |

(52) U.S. Cl.
CPC .......... *G11C 16/02* (2013.01); *G11C 16/0483* (2013.01); *G11C 16/3459* (2013.01); *G11C 2211/5641* (2013.01); *G11C 2211/5642* (2013.01); *G11C 2213/71* (2013.01); *G11C 2213/75* (2013.01)

(56) References Cited

U.S. PATENT DOCUMENTS

| | | | |
|---|---|---|---|
| 4,928,056 A | 5/1990 | Pease | |
| 5,387,880 A | 2/1995 | Kobayashi | |
| 5,602,789 A | 2/1997 | Endoh et al. | |
| 5,642,322 A | 6/1997 | Yoneda | |
| 6,157,558 A | 12/2000 | Wong | |
| 6,166,938 A | 12/2000 | Wong | |
| 6,304,903 B1 * | 10/2001 | Ward | 709/224 |
| 6,317,349 B1 | 11/2001 | Wong | |
| 6,433,621 B1 | 8/2002 | Smith et al. | |
| 6,970,988 B1 | 11/2005 | Chung | |
| 6,975,838 B1 | 12/2005 | Rofougaran et al. | |
| 7,005,350 B2 | 2/2006 | Walker et al. | |
| 7,017,089 B1 * | 3/2006 | Huse | G11C 29/38 365/49.18 |
| 7,019,584 B2 | 3/2006 | Bartel et al. | |
| 7,019,585 B1 | 3/2006 | Wilson et al. | |
| 7,206,230 B2 | 4/2007 | Li et al. | |
| 7,237,058 B2 | 6/2007 | Srinivasan | |
| 7,292,476 B2 | 11/2007 | Goda et al. | |
| 7,358,807 B2 | 4/2008 | Scuderi et al. | |
| 7,400,532 B2 | 7/2008 | Aritome | |
| 7,403,421 B2 | 7/2008 | Mokhlesi et al. | |
| 7,412,561 B2 | 8/2008 | Argyres et al. | |
| 7,450,422 B2 | 11/2008 | Roohparvar | |
| 7,489,546 B2 | 2/2009 | Roohparvar | |
| 7,505,321 B2 | 3/2009 | Scheuerlein et al. | |
| 7,515,000 B1 | 4/2009 | Jin et al. | |
| 7,560,987 B1 | 7/2009 | Cetin et al. | |
| 7,586,380 B1 | 9/2009 | Natatajan et al. | |
| 7,746,700 B2 | 6/2010 | Roohparver | |
| 7,750,837 B2 | 7/2010 | Wang et al. | |
| 8,102,705 B2 | 1/2012 | Liu et al. | |
| 8,856,464 B2 * | 10/2014 | Karamcheti et al. | 711/154 |
| 2001/0010057 A1 | 7/2001 | Yamada | |
| 2002/0171652 A1 | 11/2002 | Perego | |
| 2003/0002366 A1 | 1/2003 | Mizoguchi et al. | |
| 2003/0007408 A1 | 1/2003 | Lien et al. | |
| 2003/0012063 A1 | 1/2003 | Chien | |
| 2003/0018868 A1 | 1/2003 | Chung | |
| 2003/0117851 A1 | 6/2003 | Lee et al. | |
| 2003/0163509 A1 | 8/2003 | McKean et al. | |
| 2004/0123020 A1 | 6/2004 | Gonzalez et al. | |
| 2004/0124466 A1 | 7/2004 | Walker et al. | |
| 2004/0125629 A1 | 7/2004 | Scheuerlein et al. | |
| 2004/0137878 A1 | 7/2004 | Oyama | |
| 2004/0240484 A1 | 12/2004 | Argyres et al. | |
| 2005/0078514 A1 | 4/2005 | Scheuerlein et al. | |
| 2005/0141387 A1 | 6/2005 | Cernea et al. | |
| 2006/0034121 A1 | 2/2006 | Khalid et al. | |
| 2006/0095699 A1 | 5/2006 | Kobayashi et al. | |
| 2006/0206770 A1 | 9/2006 | Chen et al. | |
| 2006/0261401 A1 | 11/2006 | Bhattacharyya | |
| 2007/0047314 A1 | 3/2007 | Goda et al. | |
| 2007/0058407 A1 * | 3/2007 | Dosaka | G11C 15/00 365/189.15 |
| 2007/0140012 A1 | 6/2007 | Roohparvar | |
| 2007/0189073 A1 | 8/2007 | Aritome | |
| 2007/0236990 A1 | 10/2007 | Aritome | |
| 2007/0263462 A1 | 11/2007 | Roohparvar | |
| 2007/0291542 A1 | 12/2007 | Aritome | |
| 2008/0005459 A1 | 1/2008 | Norman | |
| 2008/0031044 A1 | 2/2008 | Roohparvar | |
| 2008/0062763 A1 | 3/2008 | Park et al. | |
| 2008/0158989 A1 | 7/2008 | Wan et al. | |
| 2008/0239808 A1 | 10/2008 | Lin | |
| 2008/0266957 A1 | 10/2008 | Moogat et al. | |
| 2009/0097311 A1 | 4/2009 | Roohparvar et al. | |
| 2009/0129151 A1 | 5/2009 | Roohparvar | |
| 2009/0129177 A1 | 5/2009 | Roohparvar | |
| 2009/0141566 A1 | 6/2009 | Arsovski | |
| 2009/0190404 A1 * | 7/2009 | Roohparvar | 365/185.17 |
| 2009/0254694 A1 | 10/2009 | Ehrman et al. | |
| 2009/0273975 A1 | 11/2009 | Sarin et al. | |
| 2009/0303767 A1 | 12/2009 | Akerib et al. | |
| 2010/0329007 A1 | 12/2010 | Chibvongodze | |
| 2011/0002169 A1 | 1/2011 | Li et al. | |
| 2011/0051485 A1 | 3/2011 | Chang et al. | |
| 2011/0096601 A1 | 4/2011 | Gavens | |
| 2011/0096607 A1 | 4/2011 | Roohparvar | |
| 2011/0103145 A1 | 5/2011 | Sarin et al. | |
| 2011/0103153 A1 | 5/2011 | Katsurnata et al. | |
| 2011/0134676 A1 | 6/2011 | Breitwisch et al. | |
| 2012/0005419 A1 | 1/2012 | Wu et al. | |
| 2012/0102298 A1 | 4/2012 | Sengupta et al. | |
| 2012/0250424 A1 | 10/2012 | Yoshihara et al. | |
| 2013/0028021 A1 | 1/2013 | Sharon et al. | |
| 2013/0042055 A1 | 2/2013 | Kinoshita et al. | |
| 2013/0086303 A1 | 4/2013 | Ludwig et al. | |

OTHER PUBLICATIONS

Notification of Transmittal of the International Search Report and the Written Opinion of the International Searching Authority, or the Declaration for Int'l Appl. No. PCT/US2013/036632 dated Jul. 1, 2013, 13 pages.

Maeda et al., "Multi-Stacked 1G Cell-Layer Pipe-Shaped BiCS Flash Memory," 2009 Symposium on VLSI Circuits, pp. 22-23.

U.S. Appl. No. 13/463,422, entitled Column Redundancy Circuitry for Non-Volatile Memory, filed May 3, 2012, 50 pages.

U.S. Appl. No. 13/420,961 entitled Techniques for Accessing Column Selecting Shift Register with Skipped Entries in Non-Volatile Memories, filed Mar. 15, 2012, 52 pages.

U.S. Appl. No. 61/713,038, entitled "Use of High Endurance Non-Volatile Memory for Read Accleration," filed Oct. 12, 2012, 93 pages.

U.S. Appl. No. 13/827,609 entitled "Data Search Using Bloom Filters and NAND Based Content Addressable Memory," filed Mar. 14, 2013, 82 pages.

U.S. Appl. No. 13/794,398, entitled De-Duplication Techniques Using NAND Flash Based Content Addressable Memory, filed Mar. 11, 2013, 80 pages.

U.S. Appl. No. 13/794,428 entitled "De-Duplication System Using NAND Flash Based Content Addressable Memory," filed Mar. 11, 2013, 80 pages.

U.S. Appl. No. 13/756,076 entitled "On-Device Data Analytics Using NAND Flash Based Intelligent Memory," filed Jan. 31, 2013, 67 pages.

Lu et al., Bloomstore: Bloom Filter Based Memory-Efficient Key-Value Store for Indexing of Data Deduplication on Flash, Mass Storage Systems and Technologies, Apr. 16, 2012, IEEE 28th Symposium, pp. 1-11.

Wei et al., "DBA: A Dynamic Bloom Filter Array for Scalable Membership Representation of Variable Large Data Sets," Jul. 25-27, 2011, IEEE 19th Annual International Symposium of Modeling, Analysis and Simulation of Computer and Telecommunication Systems (Mascots 2011), pp. 466-468.

\* cited by examiner

| WL | BL | BLB | BL | BLB | BL | BLB | |
|---|---|---|---|---|---|---|---|
| Sense 1 { Low | 1 | 0 | 0 | 1 | 1 | 0 | |
| Hi | 1 | 0 | 0 | 1 | 0 | 1 | |
| Hi | 1 | 0 | 0 | 1 | 0 | 1 | |
| Low | 1 | 0 | 0 | 1 | 1 | 0 | |
| Low | 1 | 0 | 0 | 1 | 1 | 0 | |
| Hi | 1 | 0 | 0 | 1 | 0 | 1 | |
| Low | 1 | 0 | 0 | 1 | 1 | 0 | |
| sense 1 | c | nc | nc | c | c | nc | |
| Sense 2 { Hi | 1 | 0 | 0 | 1 | 1 | 0 | |
| Low | 1 | 0 | 0 | 1 | 0 | 1 | |
| Low | 1 | 0 | 0 | 1 | 0 | 1 | Reverse WL Bias |
| Hi | 1 | 0 | 0 | 1 | 1 | 0 | |
| Hi | 1 | 0 | 0 | 1 | 1 | 0 | |
| Low | 1 | 0 | 0 | 1 | 0 | 1 | |
| Hi | 1 | 0 | 0 | 1 | 1 | 0 | |
| Sense 2 | c | nc | nc | c | nc | c | |
| XOR1&2 | 1 | 1 | 1 | 1 | 0 | 0 | |

Search for 00 pattern -- output column address --> data block

| | D0 | D1 | D3 | D4 | D5 | D6 | D7 | D8 | |
|---|---|---|---|---|---|---|---|---|---|
| Low | 1 | 0 | | | 0 | 1 | 1 | 0 | |
| Hi | 1 | 0 | | | 0 | 1 | 0 | 1 | |
| Hi | 1 | 0 | | | 0 | 1 | 0 | 1 | |
| Low | 1 | 0 | | | 0 | 1 | 1 | 0 | |
| Low | 1 | 0 | | | 0 | 1 | 1 | 0 | |
| Hi | 1 | 0 | | | 0 | 1 | 0 | 1 | |
| Low | 1 | 0 | | | 0 | 1 | 1 | 0 | |
| Hi | 0 | 1 | | | 1 | 0 | 0 | 1 | |
| Low | 0 | 1 | | | 1 | 0 | 1 | 0 | |
| Low | 0 | 1 | | | 1 | 0 | 1 | 0 | |
| Hi | 0 | 1 | | | 1 | 0 | 0 | 1 | Reverse pattern |
| Hi | 0 | 1 | | | 1 | 0 | 0 | 1 | |
| Low | 0 | 1 | | | 1 | 0 | 1 | 0 | |
| Hi | 0 | 1 | | | 1 | 0 | 0 | 1 | |
| Sense | nc | nc | | | nc | nc | c | nc | |

*FIG. 6A*

KEY VALUE ADDRESSED STORAGE DRIVE USING NAND FLASH BASED CONTENT ADDRESSABLE MEMORY

CROSS-REFERENCE TO RELATED APPLICATIONS

This application claims priority from, U.S. Provisional Applications Nos. 61/724,401, filed on Nov. 9, 2012, and 61/730,884 filed on Nov. 28, 2012, and is related to the following U.S. patent applications, all filed Jan. 24, 2013, and all by Steven Sprouse and Yan Li: three applications entitled "NAND FLASH BASED CONTENT ADDRESSABLE MEMORY" and having application Ser. Nos. 13/749,361 (issued as U.S. Pat. No. 8,634,247): 13/749,377; and 13/749,407; and an application entitled "KEY-VALUE ADDRESSED STORAGE DRIVE USING NAND FLASH BASED CONTENT ADDRESSABLE MEMORY" and having application Ser. No. 13/749,432, which are all hereby incorporated in its entirety by this reference.

FIELD OF THE INVENTION

This invention relates generally to non-volatile memory drives and, more specifically, to such drives using a content addressable memory or storage (CAM or CAS) based on flash memory of a NAND type architecture.

BACKGROUND OF THE INVENTION

Content addressable memories, also known as associative memories, are different from standard memories in the way that data is addressed and retrieved. In a conventional memory, an address is supplied and the data located at this specified address is retrieved. In contrast, in a content addressable memory (CAM), data is written as a key-data pair. To retrieve the data, a search key is supplied and all the keys in the memory are searched for a match. If a match is found, the corresponding data is retrieved.

Content Addressable Memories, or CAMs, can be implemented in several ways. In one sort of embodiment, a CAM is implemented using a conventional memory and an associated CPU which searches through the memory to find a matching key. The keys in the memory may be sorted, in which case a binary search can be used; or they can be unsorted, in which case a linear search is used. A CAM can also be implemented as a semiconductor memory, where every memory location contains an n-bit comparator. When an n-bit key is provided, each entry in the CAM will compare the search key with the entry's key, and signal a match if the two are equal.

SUMMARY OF INVENTION

A content addressable memory (CAM) is based on a flash memory of a NAND type architecture. Keys are written along bit lines. The keys can be written as key, inverted key pairs where, for example, the key is placed on one bit line and the inverted key on another word line or both the key and its inverse are written on the same bit line. To locate a key, a corresponding search key pattern is broadcast to all of the bit lines of a block by setting the word lines to a corresponding set of high and low read voltages. In addition to a bit line based CAM, keys can also be compared along the word line direction, allowing for large key size, such as 1 KB to 16 KB. In the word line based content search, the keys will be entered into data latches inside NAND, with an internal comparison done on all word lines and all the blocks internally on the NAND chip.

This type of NAND Flash base CAM can be used for a key-value addressed storage drive. The device can use a standard transport protocol such as PCI-E, SAS, SATA, eMMC, SCSI, and so on. A host writes a key-value pair to the drive, where the drive writes the keys along bit lines of a CAM NAND portion of the drive and stores the value in the drive. The drive then maintains a table linking the keys to location of the value. In a read process, the host provides a key to drive, which then broadcasts down the word lines of blocks storing the keys. Based on any matching bit lines, the tables can then be used to retrieve and supply the corresponding data to the host.

A first set of aspects concern a memory circuit. The memory circuit includes an array of non-volatile memory cells arranged into a NAND type of architecture, including a plurality of M NAND strings, each having a plurality of N memory cells connected in series, and a plurality of N word lines spanning the M NAND strings. Each of the N word lines is connected to a corresponding one of the N memory cells of the array, where M and N are integers. Word line driving circuitry is connectable to the second plurality of word lines, whereby each of N word lines can be concurrently and individually be set to one of a plurality of data dependent read values corresponding to a data pattern. Sensing circuitry is connectable to the M NAND strings to individually determine those of the M NAND strings that are conducting in response the word line driving circuitry applying a data pattern to the N word lines.

Other aspects relate to a method of operating a memory system, where the memory system includes an array of non-volatile memory cells arranged into a NAND type of architecture, including a plurality NAND strings and a plurality word lines spanning the NAND strings, each of the word lines connected to a corresponding one of the memory cells thereof. The method includes receiving a search data pattern from a host device to which the memory system is connected and biasing a first plurality of the word lines according to the search data pattern. Those of the NAND strings that conduct in response to the first plurality of the word lines biased according to the search data pattern being applied thereto are determined concurrently.

Further aspects concern a method of operating a non-volatile memory system. The method includes receiving on a controller circuit of the memory system a plurality of multi-bit data keys and, for each of the keys, an associated set of data from a host to which the memory system is connected. The data keys are formed into a plurality of data pages, each of one or more keys, and the data pages are written into a corresponding plurality of word lines into a first non-volatile memory array of the memory system. The associated sets of data are written into a second non-volatile memory array of the memory system. The controller circuit maintains a mapping between each of the keys and the associated sets of data.

Yet more aspect relate to a method of operating a memory system, where the memory system including a first array of non-volatile memory cells arranged into a NAND type of architecture, including a plurality NAND strings and a plurality word lines spanning the NAND strings, each of the word lines connected to a corresponding one of the memory cells thereof, wherein the first array is written as pages of data along selected word lines. The method includes receiving a plurality of data patterns from a host device to which the memory system is connected and storing the received data patterns in a RAM memory of the memory system. On the memory system, subsequently arranging the data patterns stored in the RAM memory are subsequently arranged into pages of data so that when written into first array, the data patterns arranged to be orientated along NAND strings of the first array and the pages of data are written into the first array.

Additional aspects concern to a memory system including a buffer memory section, a non-volatile memory section and control circuitry. The non-volatile memory section is connectable to the buffer memory section and includes a first array of non-volatile memory cells arranged into a NAND type of architecture, including a plurality NAND strings and a plurality word lines spanning the NAND strings, each of the word lines connected to a corresponding one of the memory cells thereof, wherein the first array is written as pages of data along selected word lines. The control circuitry is connected to the buffer memory section and the non-volatile memory section, wherein the control circuitry can: store data keys received from a host to which the memory circuit is connected in the buffer memory; subsequently form the data keys stored in the buffer memory into pages of data such that when written into the non-volatile memory section, the data keys are oriented along NAND strings of the first array; and transfer the data pages to the non-volatile memory section to be written into the first array.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-C shows another embodiment for how keys can be written along bit lines of an NAND array and searched.

DESCRIPTION OF THE PREFERRED EMBODIMENTS

Figure 1:
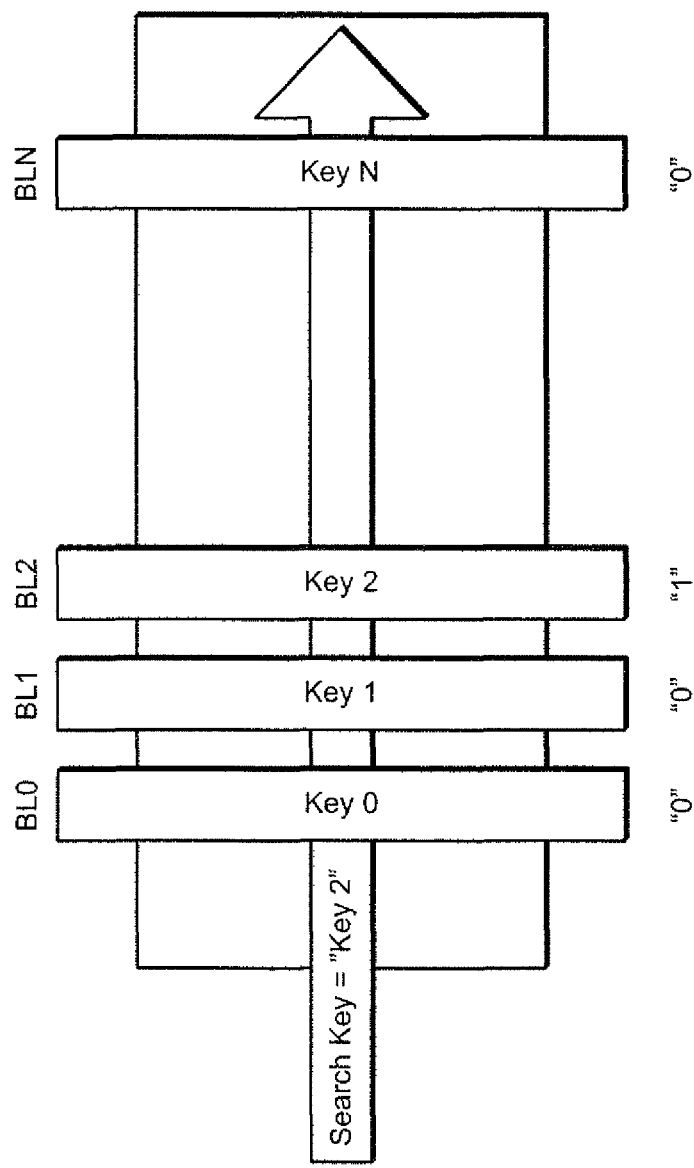
FIG. 1 is a schematic representation of a NAND array used as a CAM memory.

Content Addressable Memory Based on NAND Flash Memory

The following presents a method of using a Flash based NAND memory array as a content addressable memory (CAM) that can be realized in both binary and ternary embodiments. As described in more detail below, keys can be programmed along the bit lines of a block. The search key is then input along the word lines of the blocks, so that a bit line on which a corresponding key has been programming will be conducting. This allows for all the keys of a block to be checked at the same time.

The typical way by which a NAND memory array is read is that data is read out a single word line (or portion of a word line) at a time, with the non-selected word lines along the NAND strings being bias so that they are fully turned on regardless of the data state, removing the non-selected memory from affecting the read operation. In this way, the data content of the memory is read out a page (the unit of read) at a time. In contrast, to use a NAND flash memory as a content addressable memory, all of the word lines are set a specific data dependent value, where the data is the key, and the memory determines which bit lines then conduct, thereby determining particular bit lines corresponding to the input key, rather that the data of individual cells. An operation where sensing voltages are applied to multiple word lines in the context of an enhanced post-write read operation is given in U.S. patent application Ser. No. 13/332,780 filed on Dec. 21, 2011, (and which also presents more detail on NAND flash memory in general); however, even in that case only a few of the word lines receive a sensing voltage. Also, in prior art NAND memories, data was aligned along word lines, where data pages (for both read and write) are aligned along the word lines. Here, data is aligned along bit lines and many, or even all, of the word lines along the bit lines can receive either a high voltage sufficient to turn on a cell in a programmed state, or a low voltage sufficient to turn on a cell in the erased state. The following discussion will use the EEPROM based flash memory as the exemplary embodiment, but other memory devices having a NAND type of architecture, including 3D NAND (such as described in T. Maeda et al., "Multi-stacked 1G cell/layer Pipe-shaped BiCS flash memory", 2009 Symposium on VLSI Circuits, pages 22-23) for example, can also be used.

In a binary, EEPROM based flash memory, in a write operation each cell is either left in an erased state or charge is placed on the cell's floating gate to put the cell in a programmed state, which here are respectively taken as the 1 and 0 states. When a low value for the read voltage is applied to its control gate, only a cell in the erased, or 1, state will conduct. For cells in the programmed, or 0, state, a high value of the read voltage needs to be applied to the control gate for a cell to conduct. The keys will be arranged along bit lines of a block of the memory array. Since a cell in the 1 state will conduct for either read voltage, each key needs to be written twice, in inverted and non-inverted form. As discussed below, this can be done by writing the target key along one bit line and its inverse along another, or writing half the bit line with the (non-inverted) target key and the other half of the bit line with the inverted target key. More key info can be compressed into the NAND chain using multiple bits programming. For example, in a 2-3 bits per cell case, the key can be sorted in the controller RAM and the bits will be programed as lower, (middle) or upper pages. The following discussion will mostly be given in terms of a binary embodiment, with some specifics of the multi-state case discussed further down.

The general concept can be illustrated by FIG. 1. Target keys Key 0, Key 1, are programmed down bit lines BL0, BL1, . . . of a NAND block. Data is programmed in a separate location that can be indexed by the target key's column address number. To search the block for a key, the search key is broadcasted on the block's word lines by setting all of the word lines according to the either high or low read voltage according to the search key. (In addition to setting the word line voltages according to the key, the select gates at the end of the NAND string will also need to be turned on.) Each BL effectively compares itself to the WL key pattern for all of the bit lines in the block at the same time. If the bit line key matches the search key, the whole of the bit line will be conducting and a "1" will be read out. (Note that, as discussed further in the following, this is discussion is somewhat simplified for the reasons discussed in the last paragraph.) Once the column index of the key is found, it can be used to fetch the corresponding data from a "data" block. The key can be the hash code of the data page that will lead to the right data page by the column address of the matched NAND chain. For content matching applications, such as data compression or de-duplication, each 16 KB, say, of content can generate a corresponding hash code that can be stored along the NAND chain. If the key along the NAND chain is matched, then the data page will be compared with the comparing data along the word line to avoid hash collision cases. In other cases, the content along the word line may not be a hash value, but characteristics of the data elements that can be searched as a keys to data; or the bits lines themselves main be the elements of the data themselves, rather than a pointer to a data base.

Under the arrangement illustrated by FIG. 1, all of the bit lines of the array, and consequently all of the keys, are searched at the same time. In arrays that do not use an all bit line type of architecture, the number of keys searched simultaneously would be the number of bit line sensed in parallel, such as half of the total in an odd-even arrangement. The size of the key is the number of word lines. In practice, these maximum values of the keys will typically be somewhat less, since some column are usually set aside for defects, for instance.

As noted above, since a memory cell in either the 0 or 1 state will conduct for a high read voltage, the key will need to be entered twice, both non-inverted and inverted. This can be done by either programming the target key on two bit lines, reducing the number of keys by half, or programming both versions of the key on the same bit line, reducing the key size by half. However, given the size of available NAND blocks, even with these reductions the number of keys that can be checked in parallel is quite large. Relative to some other memory technologies, NAND flash memory has relatively large latencies in its operation, but in many applications this would more than be offset by the number of keys (bit lines) that can be checked in parallel (128K, for example). The process can all be done on-chip and, as only the bit lines that meet the matching case conducting current, with relatively low power consumption, so that compared to toggling out all of the data from the memory and doing the compare in the controller, it is a process of relatively low power and higher speed.

Looking at some implementation detail, an exemplary embodiment can be based on a flash memory where the indices are saved on the 128 Gb NAND chains. An all bit line (ABL) architecture is used where one sensing operations will perform a match operation on all of the indices on a block at the same time. Extra column redundancy is included to avoid any bad columns (more detail on such redundancy and the accessing of columns, as well as flash memory in general, can be found in the following US patent publication/application numbers: US-2005-0141387-A1; US-2008-0266957-A1; US-2011-0002169-A1; US-2010-0329007-A1; Ser. Nos. 13/463,422; and 13/420,961.) Two copies of the same data, Data and Data Bar, are written into the NAND chain. In the example, this allows for 16 KB/2/2-32000 sets of information with a 128 bit key.

When writing in the keys, these will be typically writing in on a page by page basis, although in memories that allow it, partial page programming can be used to write part of the keys, with more added later. Such partial page programming is typically more limited for multi-states implementations than in binary blocks. As one example, the data can be shifted on to the memory and the inverted data can be generated on the memory to save effort on the controller for these data manipulations, where the data and data bar can be written without shifting in the data twice, the data written first, the inverse generated is then written. Both the keys and the data can be input into the memory system, or in some cases the keys could be generated on the memory system by the controller from the data, such as by generating hash values from the data to use as keys. If the keys are to be sorted before being written along the bit lines, this will typically be done on the controller due to the amount of data involved, such as multiple blocks' worth of data. For example, the data could initially be written in a particular area, say die 0, plane 0, blocks 0-15, and then sorted and written into the blocks having been sorted to the block level. Alternately, the keys could be assembled in RAM (either on the controller or on a separate chip) or cache NAND memory (such as described in U.S. provisional application No. 61/713,038) before sorting them to the desired level of granularity and writing them into a set of blocks.

As discussed further below, the data/data bar pairs can be written on two bits lines or on a single bit line. When the data/data bar pairs are written on two bit lines, such as discussed with respect to FIG. 4, the pairs can be written next to each other or in other patterns, such as writing the data bit lines in one area and the inverted data bit lines in another zone. When both parts of the pair on written on the same bit line, as discussed below with respect to FIG. 6A, they can be written in a top/bottom format or interleaved. For example, when the data and inverted data are interleaved to alternates down the word lines, this has the advantage of that at most two elements in a row are the same down the bit line; further, interleaving can lead to efficient data transfer on to the memory as first a page of data is transferred on the memory and the next page can just be generated in the latches by inverting all the bits, as the next page is the inverted data of the first page.

The matched index can then be linked to other data corresponding to the determined column address; for instance, the keys could be a hash value, such as from a Secure Hash Algorithm (SHA), used to point to the actual data that can also be stored elsewhere on the memory itself. All the matching can be done inside of the NAND chip and, when the match is found, the column address can also be transfer out if needed or just the data, if also stored on the NAND chip, can be transferred out.

To efficiently implement the use of a NAND array as a CAM memory, so changes can be made to the word line driving circuitry. To broadcast a search key down the word lines of a block, in addition to turning on the select gates on either end of the NAND strings, each word line of the block needs to be set to either the high or low read voltage according to the search key. This is in contrast to typical NAND operation, where only a single word line at a time is selected for a read voltage, with all of the other word lines receiving a pass voltage sufficient to remove them from influencing the sensing regardless of their data state.

Figure 2:
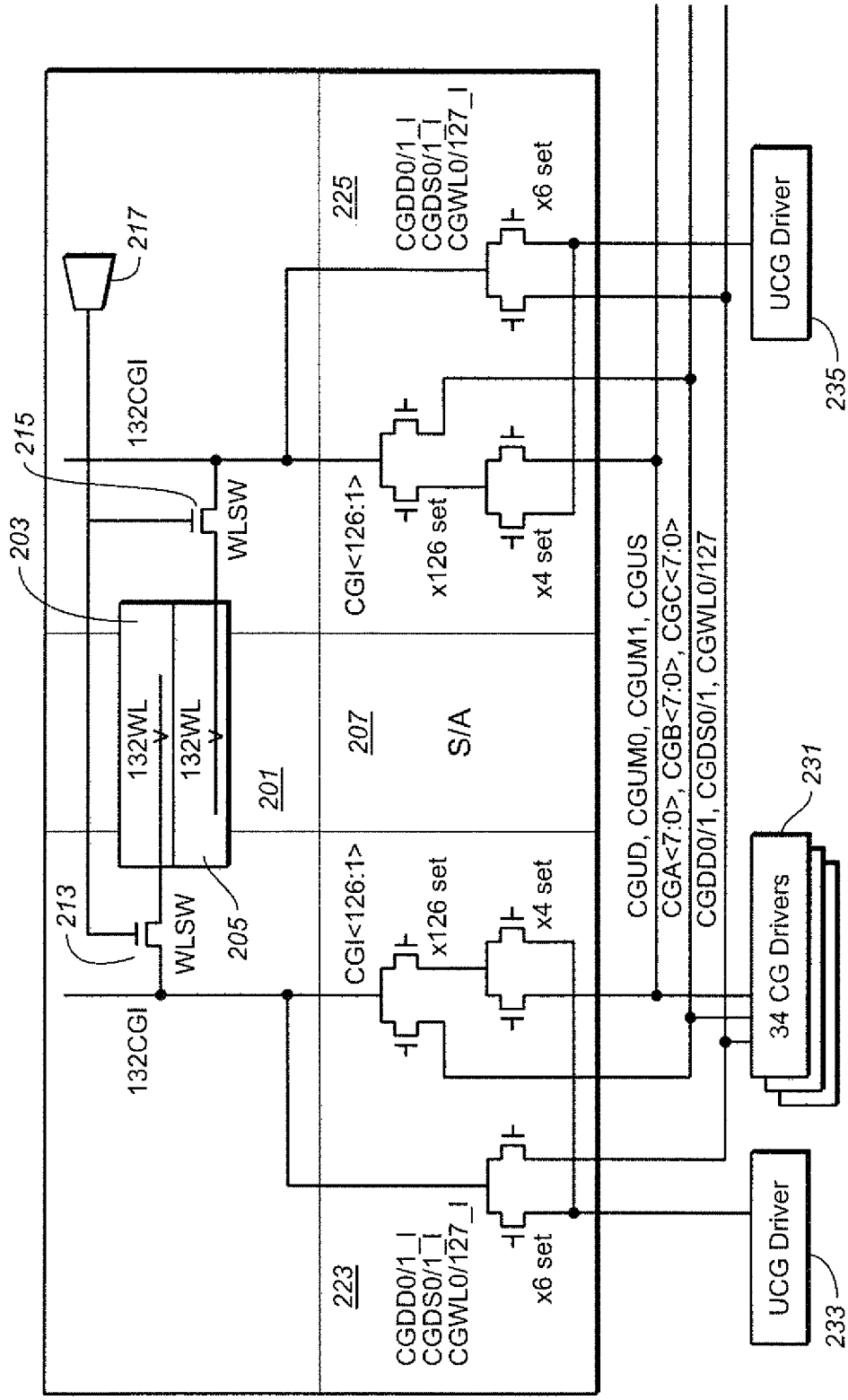
FIG. 2 is a schematic illustration of the network of some of the elements to supply the word line in a NAND array for conventional operation.

FIG. 2 is a schematic illustration of the network of some of the elements to supply the word line in a NAND array for conventional operation. At 201 is the cell array for a plane of a NAND chip, with two blocks explicitly marked out at 203 and 205. Each block's word lines are feed by a word line select gate WLSW 213 or 215 as controlled from select circuitry at 217. The bit lines are not indicated, but would run down to the sense amp block SIA 207. The various control gate voltage CGI are then supplied to the select gates 213 and 215 from the drivers CG drivers 231 and UCG drivers 233 and 235 by way of switches 223 and 225, respectively. In the exemplary embodiment shown here, a block is taken to have 132 word lines, where a pair of dummy word lines are included on both the drain and source sides of the NAND strings. The UCG Drivers 233 and 235 are for supplying the pass voltages used on unselected word lines during program, (standard, non-CAM) read or verify operations. As this level is used on the large majority of word lines, these can be lumped together for a single driver. The selected control gates are biased to VPGM at program, CGR voltage at read or verify. In FIG. 2, CGI<126:1> is the decoded global CG lines. CGI<0> and CGI<127>, that are here biased differently from other 126 word lines due to edge word line effects. The dummy word line bias CGD0/1 is for the drain side dummy word lines and CGDS0/1 is for the source side ones.

Figure 3:
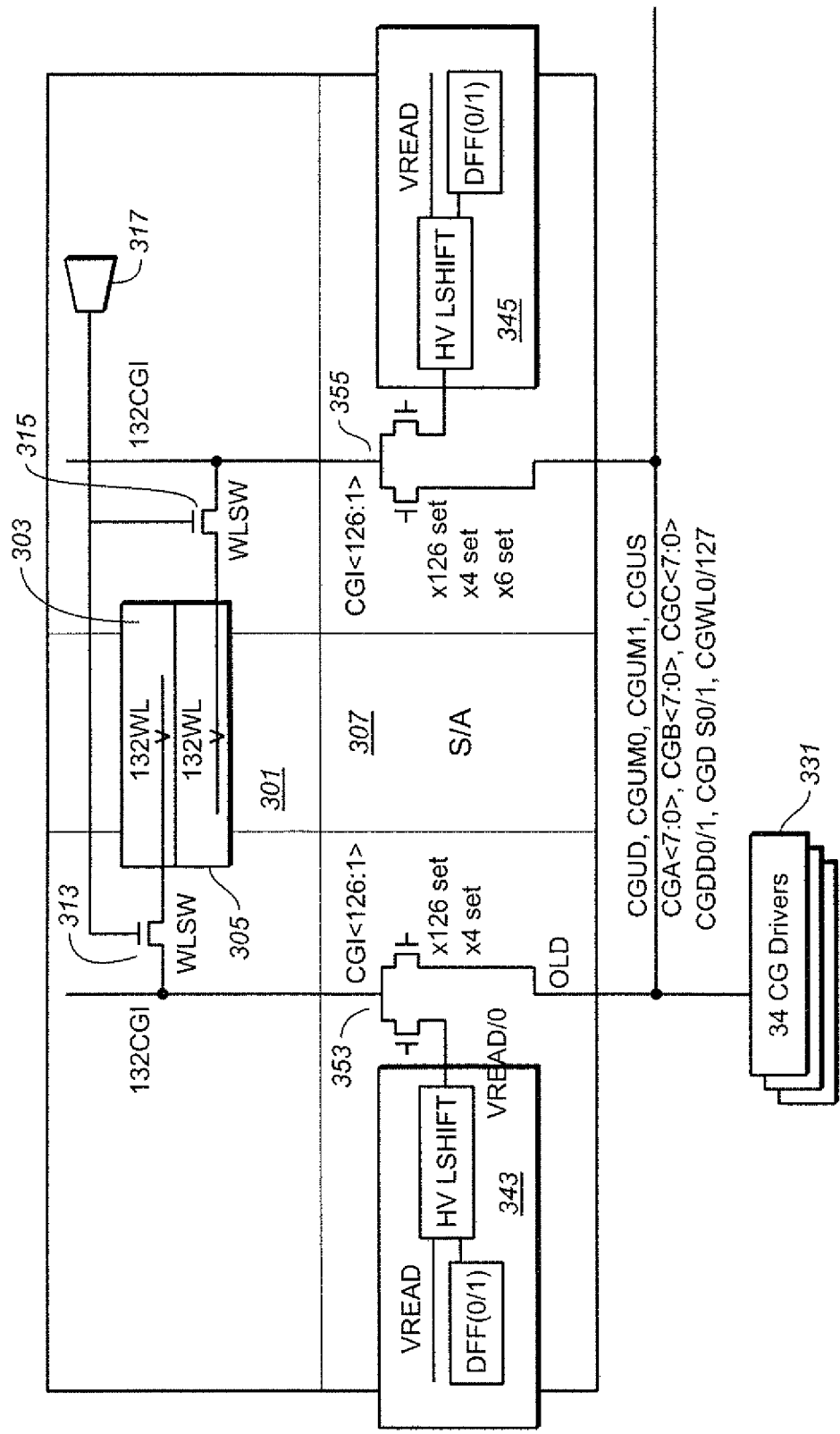
FIG. 3 is a schematic illustration of the network of some of the elements to supply the word line in a NAND array for CAM operation.

For a typical NAND memory operation, only a few word lines at a time are individually biased. In addition to a selected word line, adjacent or edge word lines may receive special bias levels to improve operations. Consequently, existing word line drivers are arranged so that they can only take care of a handful of word lines. With logic changes, it may be possible to drive up to perhaps two dozen or so word lines. However, to drive all the word lines of a block (here 128, ignoring dummies) will require additional analog drivers. FIG. 3 illustrates some of these changes.

The array 301, blocks 303 and 305, select circuitry 317, CG Drivers 331, and switches 313 and 315 can be the same as in FIG. 2. The additional word line drivers are shown at 343 and 345 and can supply the word lines through respective switches at 353 and 355. In each of 343 and 345, the level shifter HVLSHIFT receives the voltage VREAD and a digital value DFF(0/1) for each word line. The level shifter then converts the digital values of 0, 1 for the broadcast key to the analog high and low word line levels. As the memory cells will still need to be written (both programmed and program verified), the other circuit sketched out in FIG. 2 will still be present, though not shown in FIG. 3 to simplify the discussion. It may also be preferable to make some changes to the sensing circuitry S/A 307 to more efficiently perform the XOR operation described below between the pairs of bit lines holding a key and its inverse.

Figures 4, 5:
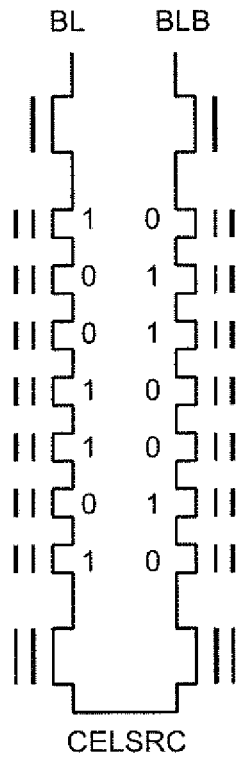
FIG. 4 shows one embodiment for how keys can be written along bit lines of an NAND array and searched.
FIG. 5 given some detail on how a key/inverse pair from FIG. 4 is programmed into a pair of NAND strings.

FIG. 4 shows the encoding of the keys along bit lines, where the key is entered twice, in non-inverted and inverted form. Here the bit lines are labeled BL for the non-inverted key and BLB for the inverted version. Here the pairs are shown as being adjacent, although this need not be the case, but will typically make XOR-ing and keeping track of data easier. Also, this arrangement readily lends itself to NAND arrays using an odd/even BL arrangement. As shown in the half of FIG. 4, for reference a key of all 1s is written along BL1 and a key of all 0s is written along BLn, with the corresponding inverted keys at BLB1 and BLBn. For the defective bit lines, the bit line either stuck "0" or stuck "1" regardless of the word line voltage bias. The XOR results between the two read results will always yield "1". The BL and BLB data pattern will eliminate the defected bit lines from yielding match results mistakenly. In this example, only seven word lines are used. A more interesting key of (1001101) is entered on BLn+1, with its inverted version at BLBn+1, as also illustrated in FIG. 5.

FIG. 5 shows the two corresponding NAND strings, where 0 is a programmed cell, 1 a cell left in its erased state, the cells being connected in series down the NAND strings to the common source line CELSRC. To search for this key, it is encoded as low read voltage for the 0 entries and high read voltage for the 1s. The search key is shown at the left of the top of FIG. 5. When put onto the word lines, this correspondingly finds that BLn+1 is conducting (and BLBn+1 is non-conducting), as shown by the "c" (and "nc") in the sense 1 row. However, BL1 and BLBn are also both conducting, as a cell in the 1 state will conduct for either read value.

The second sensing (these can be performed in either order) is then made with the search reversed. Although BL1 and BLBn are still conducting, the result from the key actually sought has changed: BLn+1 is now non-conducting and BLBn+1 conducts. By taking the result of the two reads and XOR-ing them, the sought key will give a 0 on the corresponding bit line and also on its inverted version. Consequently, by searching for the 00 pattern in the XOR data, the output column address can be found and the corresponding data block accessed. Under the sort of embodiment used in FIG. 4, two reads are needed for the pattern match and internal pattern detection on the NAND device can judge if there is a match. The redundancy of the BL/BLB pairs provides redundancy to help protect from bad bit lines, but a second pair can also be kept for further protection. A copy of the key can also be kept with any associated data and used to check the match, where this copy can be ECC protected. Additional protection can also be provided by each bit line including several (8, for example) parity bits, for error detection and correction purposes, where the redundancy bit are preferable along the same bit lines for all of the keys so that these parity bits can either be read or taken out to the comparisons by use of a "don't care" value applied to these word lines, as described below. For example, the data can be read when checking when checking the data, as either part of a post-write read or other data integrity check, but ignored during CAM-type operations.

Generally, for both this and other embodiments described here, a post-write read can be used to insure that the keys have been successfully written into the NAND memory, as any error bits could prevent a NAND string from conducting and would give rise to "false negatives" when matching. If an error is found, the bad data can be rewritten. In the exemplary NAND flash example, the incorrectly written data can rewritten to another data block and any key-data correspondences updated accordingly. More detail on post-write read operations can be found in U.S. patent application Ser. No. 13/332,780 and references cited therein.

In terms of performance, in the case of a 16 KB page of 128 bit keys, if two copies of the both the data and its inverse are stored, the corresponds to 4 KB of keys, or 32000 keys. (As all of the word lines are sensed at once, so that here, a "page" involves a sensing of all the word lines of a block rather than a single word line.) If this page of 32000 keys is sensed in 50 us, this is a rate of 0.64 GC (Giga-compares) per second per plane. If four planes are sensed in parallel, this can lead to 2.56 GC/s at a consumption of about 200 mW.

FIG. 6A illustrates a second embodiment for how the key can be stored along a bit line. In this case, both the key and its inverse are written onto the same bit line. For a given block, this means that the maximum key size is only half the number of word lines, but this allows for the search key and inverted key to be broadcast at the same time. Consequently, the search can be done in a single read.

Referring to FIG. 6A, this shows 14 different word lines with the keys entered in the top half and the inverted versions of these same keys entered in inverted form in the bottom half of the same bit line. Thus, taking the bit line at D7, rows 1-7 hold a 7 bit key, and rows 8-14 the inverted version of the same key. (Although arranged similarly to FIG. 4, in FIG. 6A the top and bottom halves represent 14 different word lines where the top-bottom division is the key/inverted key boundary, whereas in FIG. 4, the top and bottom are the same seven word lines repeated twice for two different sensing operations.) For comparison purposes, the keys shown in FIG. 6A are the same as in FIG. 4, with the bit line of D7 holding the sought for key in the top half and its inverse in the bottom half, and D8 holding the inverted key so that these two halves are switched.

To search for a key, the search pattern is then broadcast on the top half word lines and its inverse on the bottom half word lines. Any bit lines with a matching keys, in this case D7, will then conduct, as shown at bottom were "nc" is non-conducting and "c" conducting. If redundancy is desired, the non-inverted version can also be programmed in as at D8 and then detected by broadcasting the non-inverted search key, and the bit lines reads searched for a 11 pattern, which can then be output as a data pointer. If further redundancy is wanted, the key or key/inverse pair can be written into the array a second time and parity bits can also be included, much the same way as discussed for the embodiments based on FIG. 4. The defective bit line should be isolated with isolation latch and not used. If some defect shows up as a stuck "0", it can potentially generate the "false" match. In this case, the data content should be compared in order to confirm whether this is a real match or a false match. The other most common reliability issue is that some cells may have lost some charges after some time, that will also produce a "false" match. Then a content match check will eliminate the "false" match error. The word line voltage bias can be budgeted a little higher to avoid "missing" a match, which is very harmful error. A "false" match can be double checked with the content check.

Figure 6B:
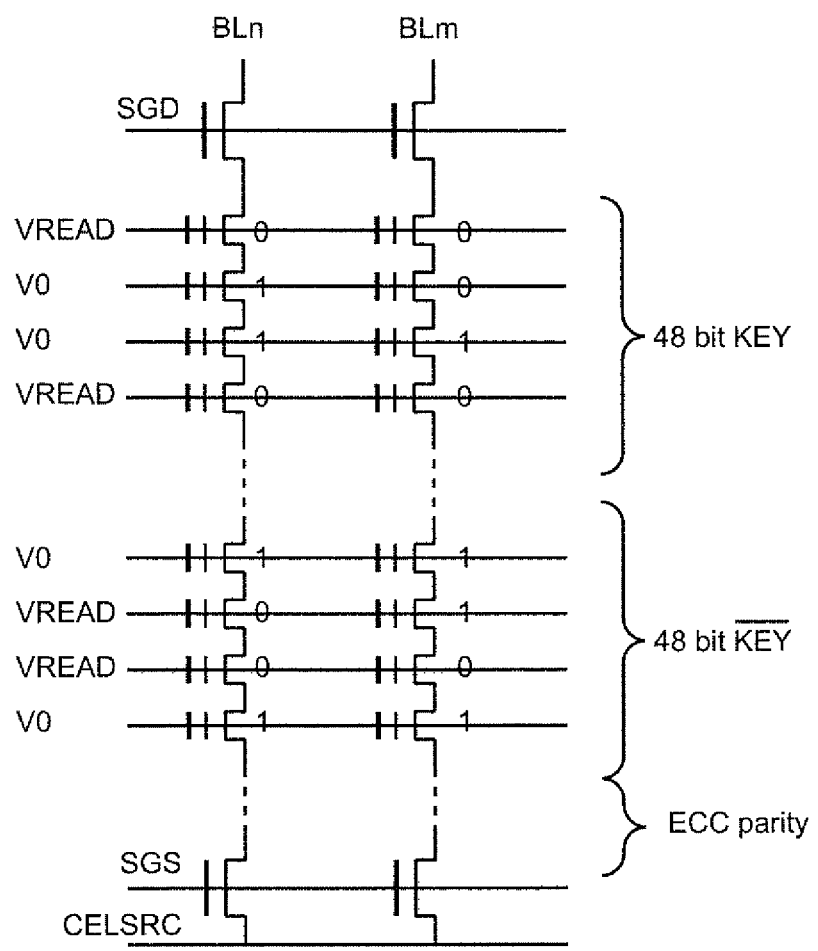

FIG. 6B schematically illustrates the key/inverse pairs along NAND strings. Two strings are shown (for bit lines BLn and BLm) each having a drain and source select gate (SOD, SGS) on either end, where the source ends are then connected along the source line CELSRC. In between are the memory cells on the strings connected in series. In this example, the stings has cell capacity to hold a 48 bit key, its 48 bit inverse, and some parity bits. Although shown here with the key along the first 48 word lines followed by the inverse along the next 48 word lines, more generally they can interleaved in various ways; for example, each of the key bits can be followed it inverse in the next word line as, when programing, this allows for a page to loading in and written, after which the programming data can be inverted in the latches and written into the next word line. The parity bits can also be variously located along the NAND string, although having them grouped can lead to easier decoding when searching the keys.

Each of bit lines BLn and BLm show a portion of a key along four adjacent word lines and the corresponding four adjacent word lines holding the inverse. To search the keys of the block, the word lines are then biased according to the search key, where the high sensing voltage used to checking for "0" values and the low sensing voltage to check for '1" values. The high value is here taken as VREAD, and can be the same used in a typical NAND memory for non-selected word lines, and the low sensing values is labeled as V0. The select gates will also need to be on and VREAD should also be applied to the word lines holding parity bits as these as used for data integrity checks and are not meant factor into key search operations.

To make the stored keys more robust, the memory can shift the sensing margins to favor "false" matches rather than misses. (Similarly, the programming parameters can be shifter relative to those typically used.) The "false" matches can be examined by the data check later to help remove any false positives. A duplicated key can be used to check for preventing error, where these duplicates can be stored on other NAND strings, with the associated data, or other locations on the system. Relative to a standard NAND memory, this arrangement will need to add extra circuitry, as described with respect to FIGS. 2 and 3.

Figure 6C:
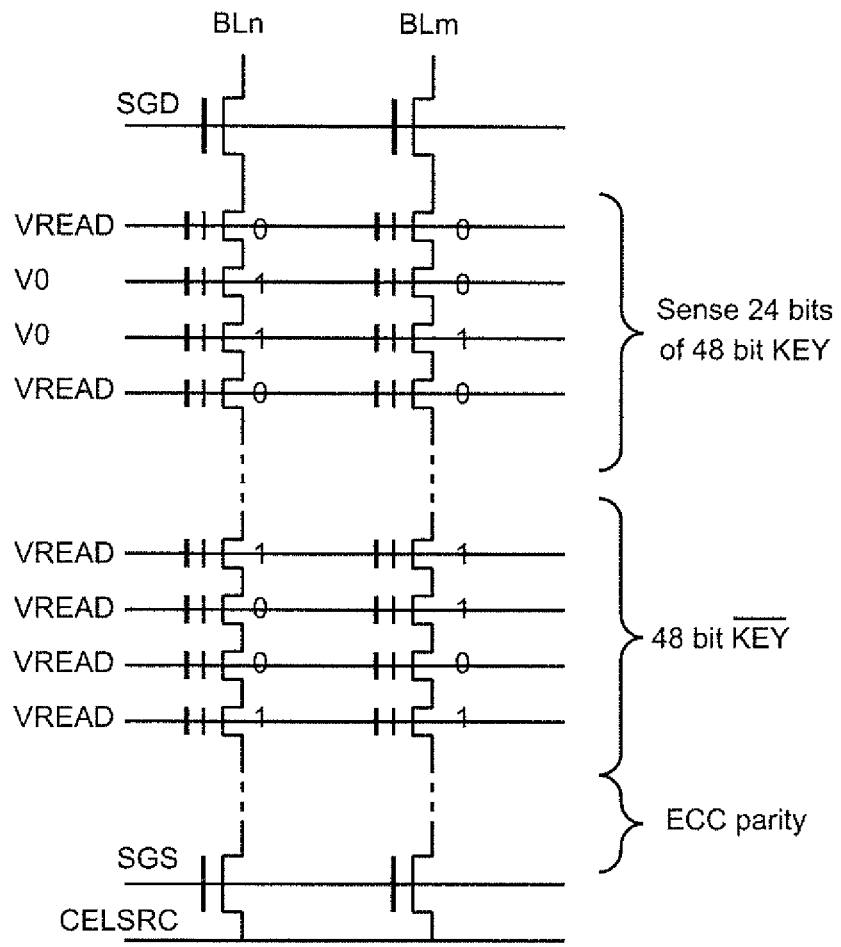

Rather than sense the search for the full key (or key/inverse) in a single sensing, a partial key can be searched, allowing the full key/inverse matching to be done incrementally. This can allows for the less independently settable word line levels, resulting in less circuitry changes relative to a standard NAND memory, but it can require some logic changes. The full key/inverse can be searched sequentially, where each subsequent sensing will be judged based on previous sensing results. For the example of FIG. 6B, rather than check all 24+24 word lines of the key/inverse in one go, a partially key check of, say 24 bits at a time can be done: if no matches are found, the process can move on to any other blocks holding keys; if a match is found, a second partial key can be checked, and so on. The subsequent checks can either do all of the NAND string again and compare the results of the partial searches, or only check those which have conducted in the previous partial key matches. FIG. 6C illustrated such a partial key comparison, where only 24 bits of the 48 bits in the key are being checked. The other bits of the key and its inverse are then set to the "don't care" value, as shown at the corresponding bits of the inverse that are set at VREAD.

As each key is written in twice (non-inverted, inverted) on a bit line, a block with 128 word lines can hold 64 bit keys, while 128 bit keys would need blocks of 256 word lines. Also, it should be noted that although the key/inverted keys are here shown as being written respectively into the top half/bottom half of the word lines. More generally, the keys and inverse pairs could be interleaved in any desired fashion, as long as it was consistent for all of the keys in the block; however, this would require keeping track of the arrangement. The interleaved pattern along the NAND chain may be preferred since the data can be inversely program in another WL without loading the data again. There are some other coupling effect may also benefit from interleaving the inverted and non-inverted data on adjacent word lines. In terms of performance for this type of embodiment, for a 16 KB page of 64 bit keys, if a duplicate key/inverted key pair is kept, this is 8 KB, or 64,000 keys. At 35 us per sensing, this gives 1.82 C/s/plane. If 4 planes are operated in parallel, this is 7.3 CG/s at around 200 mW.

For either of the embodiments of FIG. 4 or FIG. 6A, the method uses the inherent "AND" functionality available in a NAND Flash memory to compare thousands of keys in a single sensing operation. This method has several major advantages over traditional CPU- or semiconductor-based CAM memories. For one, as the comparison is done "on die", there is no need to transfer the data out of the memory. This saves both time and IO power. Furthermore the actual comparison operations use less power than conventional memories. As all of the bit lines are sensed at the same time, with only the matching NAND chain is conducting current, the NAND based CAM is highly parallel; for example, in a NAND flash memory with 4×8 KB planes, (32K×8 bits/byte)/2=128K keys can be checked in one sense per die. If a sense can be done in 35 us, an even/odd sense as described above with respect to FIG. 4 will take 50 us. This is 128K keys in 50 us, so that an entire 8 GB die (2000 blocks) could be sensed in ~100 ms. The corresponding energy consumption is on the order of 200 mW. To increase performance, multiple die can be operated in parallel.

As noted in the Background section, keys can be stored in a CAM as either sorted, in which case a binary search can be used; or as unsorted, in which case a linear search is used. This is also true of a NAND based CAM, except that as NAND based CAM can be searched at the block level, in a sorted CAM the keys need only be sorted to the granularity of the block or the number of blocks that are sensed in parallel. The CAM allows for a binary search, but at the block level due to this parallelism. Even for linear searches, this degree of parallelism can make linear searching comparable or even faster than binary searches for fairly large data sets. Again, for any of these arrangements, performance here can also be improved by running multiple die in parallel.

The keys can be sorted based on a given number of most (or least) significant bits. A sorting based on significant bits is generally most useful when the key or content being searched is not a hash value, but a set of characteristics or data itself. In this case, the sorted data in each black would all share a certain number of most significant bits for their keys.

Content addressable memory exist in both binary form, where the search key consists of 0 s and 1 s as described above, and ternary form, where the search key can also include "don't care" value. As discussed above, when a high read value is broadcast along a word line, all of the cells along that word line will conduct regardless of its state. This property allows for a "don't care" value to be implemented by setting the corresponding word line to the high read voltage for both the key and its inverse; that is, when sensing with the key and its inverse (in either the second read of FIG. 4, or the lower half of the word lines), the don't care values are set to the high read value for both the key and its inverse, while the other values of the key are inverted as before.

These properties of a NAND based CAM also make it particularly suited to a number of other uses. For instance, as large numbers of keys can be searched in parallel, this allows for all copies of the same key in the searched blocks to be determined in the process, improving efficiency of de-duplication operations of the sort that are valuable in cleaning up data bases. The NAND structure also makes for a CAM useful as a Bloom filter as an intersection of multiple search keys can be formed by setting any values that differ between the keys to the high read voltage in the combined search key, which can then be used to search the horizontally stored keys of one or more blocks in parallel.

The use of "don't care" values can also be used to perform a type of "iterative" search. This can be used the keys may have, or possibly have, some number of bit errors. One or a series of reduced keys, where some subset of values are set to "don't care" for different entries, are used for searching. Several different such keys, where a different subset of values is masked out in each, are then iteratively used to check for matches among the written keys.

Another example of where a series of reduced search keys can be employed is where the content is itself a data set, as opposed to say a hash value. For example, it could be values from image processing. In such a case, the content of the block could be searched to a desired number of significant bits, by setting bits of lower significance to "don't care". Similar arrangement could also be used for patterning matching of the content or for cases where the keys are properties of main data content.

Consequently, due to its parallelism, relatively low power consumption, or both, NAND based CAM can be used in many applications, such as data base searching, voice recognition, DNA matching/genome searches, cryptography and so on. It can lend itself to CAM based indexing and can be incorporated, for example into CAM indexed SSD systems, So far the discussion has mainly considered the case of binary NAND memory for CAM use. More generally, multi-state (MLC) memory can also be used; for example, in a mixed binary-MLC memory, the keys could be stored in binary memory for CAM use, while data to which the keys pointed could be stored in MLC areas. It is also possible to use MLC NAND memory for CAM, using 2 to 3 bits per cell, for example, in key matching. Using 2 to 3 bits per cell, the NAND chain can store longer keys. In the sort of embodiment described with respect to FIG. 6A, where a key and its inverse are written into the same word line, a 128 cell NAND chain in binary operation can store 64 bit keys, while a 128 NAND chain with 2-bits per cell can store 128 bits keys. Similarly, 3-bits per cell operation can store 192 bit keys.

Figure 7:
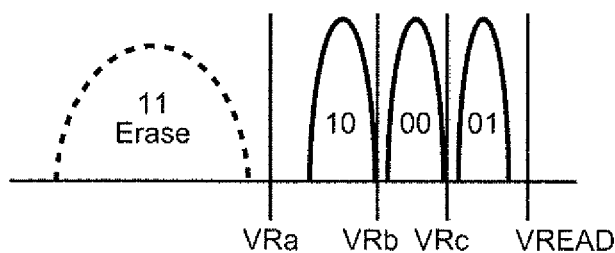
FIG. 7 shows an exemplary encoding of 2-bits per cells for four state memory cell operation.
Figure 8:
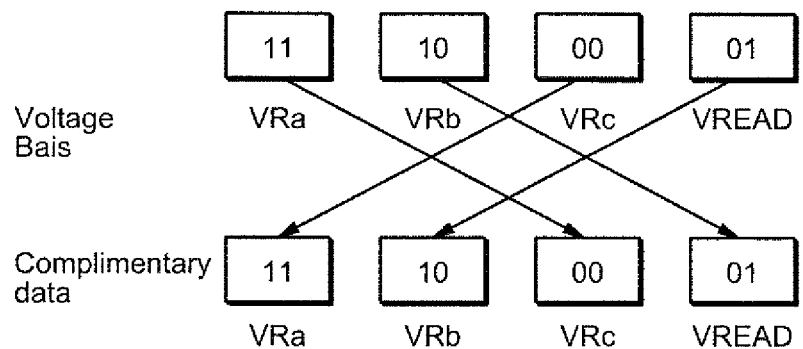
FIG. 8 shows how the data states and the complementary data used for the inverted keys correspond in the 2-bit per cell example.
Figure 9:
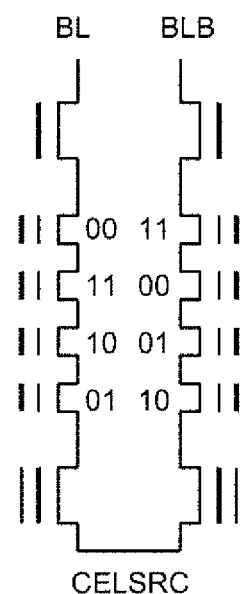
FIG. 9 shows an example of how a key would be encoded onto a 4 cell NAND string on bit line BL and its inverse on bit line BLB.

FIG. 7 shows an exemplary encoding of 2-bits per cells for four state memory cell operation. As shown, the erased state is encoded as 11, the first state up (or "a" state) is 10, followed by 00 (for the "b" state) and 01 (or "c" state). The various sensing levels are also shown. FIG. 8 shows how the data states and the complementary data used for the inverted keys correspond. FIG. 9 shows an example of how a key ({00111001}) would be encoded onto a 4 cell NAND string on bit line BL and its complement on bit line BLB. In the MLC CAM embodiment, the system can use one or two word lines along the NAND chains to store the parity bits of each NAND chain in order to check on the integrity of the NAND chain. As with the binary case, manufacture defective columns can be isolated out and more redundancy along the word lines (duplicated data) can further protect the keys' integrity. Also, the complimentary data shifted as illustrated in the figures to provide more sensing margins.

In the above, keys were written down the bit lines of the array, with the search key broadcast along the word lines, allowing the keys along a block's bit lines to be searched in parallel. The arrangement can also be reversed, where NAND array can also be operated so that the content or key matching is in the word line direction. Under this arrangement, one or more keys would be written along each word line (that can be very long keys), an arrangement that can be useful in several different circumstances. Multiple short keys can be stored along the word line direction as well. If the keys are encoded so as to have significance as a 2D array of values, this would allow for content searching in both of the bit line and word line directions, although the more typical situation would just be for content matching in the word line direction. For instance, as word lines are much long than bit lines, a word line based CAM allows for the use of longer keys. Also, as data is written in page along word lines, it may be more convenient, at least initially, to write incoming key data along word lines. This would then allow for key to be searched as written along the word lines. If desired, the keys could then be rewritten along bit lines, where they could then be searched as described above. Due to the amount of data involved, to move the keys from a word line orientation onto a bit line orientation, once a block worth of the keys are assembled they could be read off of the NAND memory into the controller and then rearranged and written along bit lines; alternately, this rotation of the keys could be performed on the NAND device, although this will typically require the memory chip's structure to modified to accomplish this. This process of initially writing the keys along word lines, transferring the keys to the controller, and rearranging them to be rewritten onto bit lines can also include the sort of sorting process described above prior to rewriting them back in a bit line orientation.

Figure 10:
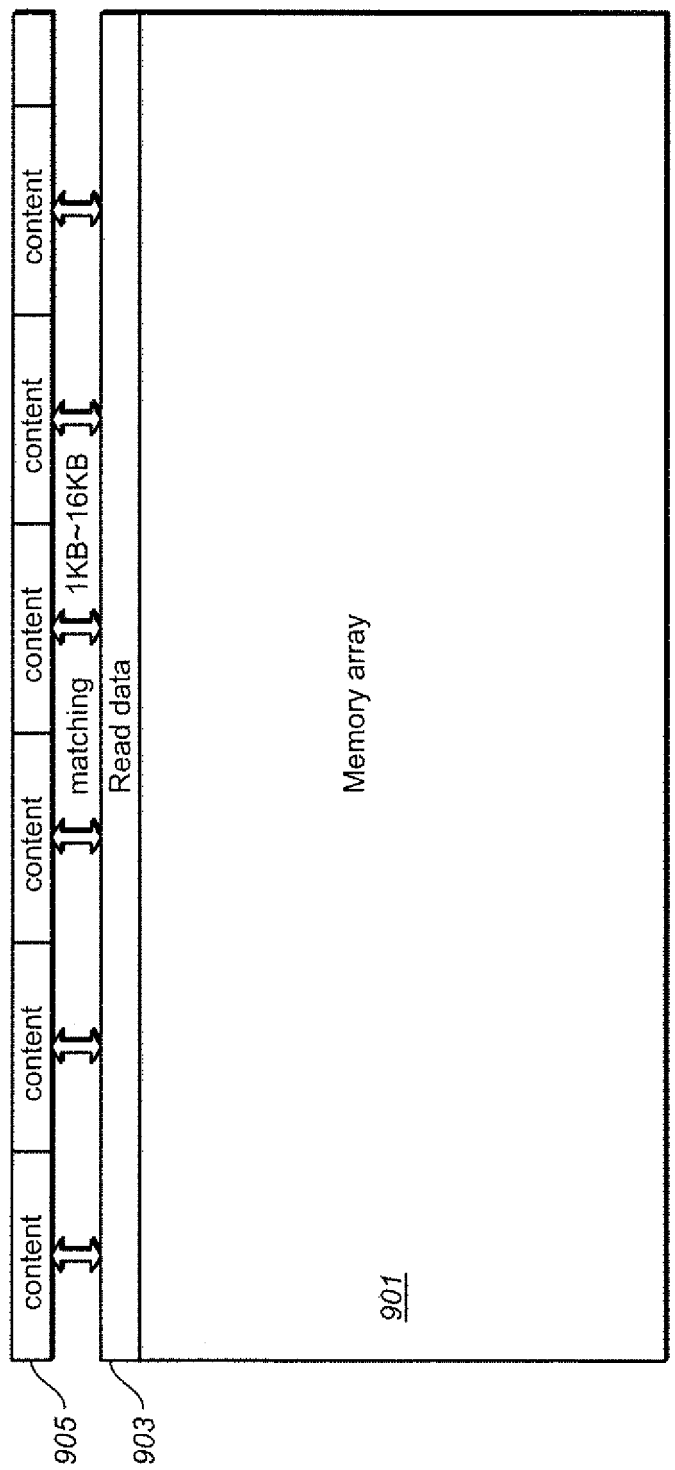
FIG. 10 illustrates the process of matching of content in word line direction.

The process of matching of content in word line direction is illustrated with respect to FIG. 10. As the system receives keys, these can be formed into pages of one or more keys and written into the memory array 901 along word lines. To match content, the system inputs the matching content of one or more search keys into a matching buffer or register 905, which can then be used to look for duplication content along the word line. The data along a word line is read from memory array 901 into a buffer or register 903. The memory can then perform internal match operations between the read data in buffer 903 and search data in buffer 905, where some number of bits ignored, if desired. The ignored bits can either be to "don't care" values, because some read error can occur on the read. These ignored bits can be corrected with error correction in the controller when a match is found. Typically, the smallest length of key/content along the word line that can be compared is 1 KB, while the longest length of key/content that can be compared in one plane is 16 KB. If the key length is smaller than 1 KB, the key can be duplicated in chunks patterns to do the pattern matching with more parallelism. Then the matched case will produce a group of "1" and the un-matched case will produce 50% "1"s. Circuitry can detect if a word is all "1"s to judge the match or miss. If there are some "0"s in a word, this word can be discarded as a miss. In order to prevent that some read errors produce a miss when it should be a match, a majority voting circuitry can be employed to choose the word with majority "1"s for matching. Some words can be masked out by marking the isolation latch to be "ignored". To simplify operations, it is typically preferable to write the beginning of a file to aligned with certain columns. After finishing a compare on one word line, the next word line content can be compared in a similar sequence.

Key-Value Addressed Storage Drive Using NAND Flash Based CAM

This section considers the incorporation of the sort of NAND Flash content addressable memory (CAM) or content addressable storage (CAS) described above in a storage drive. Conventional storage drives, such as solid state dives or hard-disk drives (SSD or HDD), are addressed by a logical block address (LBA) to read and write data stored on their physical media. These employ logical to physical address translation tables to locate the data, where the address translation table is stored on flash, in DRAM, or on magnetic media and is updated on the basis of sectors, bytes, or pages. Typical sizes for such addresses are 32, 48, or 64-bits. In some applications, such as in databases, it is desirable to have large keys (of hundreds or thousands of bits) that can address a space much larger than the number of elements in the database. In these cases a content addressable memory utilizing key-value pairs is used to index the elements stored in the device.

In a content addressable memory, data is written as a key-data pair. To retrieve the data, a search key is supplied; all the keys in the memory are searched for a match. If a match is found, the corresponding data is retrieved. This section presents a storage drive using a Flash based NAND array as described in the preceding section as a content addressable memory that is addressed using key-value pairs instead of a logical block address. This drive can provide both Binary and Ternary search capability, meaning that bit patterns in the key can have the values 1 or 0 as well as "don't care" entries. This type of NAND based CAS drive can then be used to replace other implementations of CAM or CAS functionality, such as those employing a database, that would usually include a host CPU, DRAM, and storage media.

Consequently, this section applies the of operation of a NAND flash memory as a pattern matching engine from the last section to a storage device that is indexed using key-value pairs instead of conventional logical block addresses. The device can use a standard transport protocol such as PCI-E, SAS, SATA, eMMC, SCSI, and so on. When used in a pattern matching mode, the NAND cells not only store values, but can also be used to compare their stored values with an input value. In the examples of this section, target patterns are stored along bit lines, although the word line based storage discussed above can also be used. In the bit line example, the pattern to be matched is broadcast down word lines. If all the elements in the NAND chain match their target pattern, the NAND chain (bit line) will conduct. The position of the conducting bit line can be used as an index in to another table that can be used to retrieve data that is associated with the target key. This is shown in FIG. 11, that expands upon FIG. 1.

Figure 11:
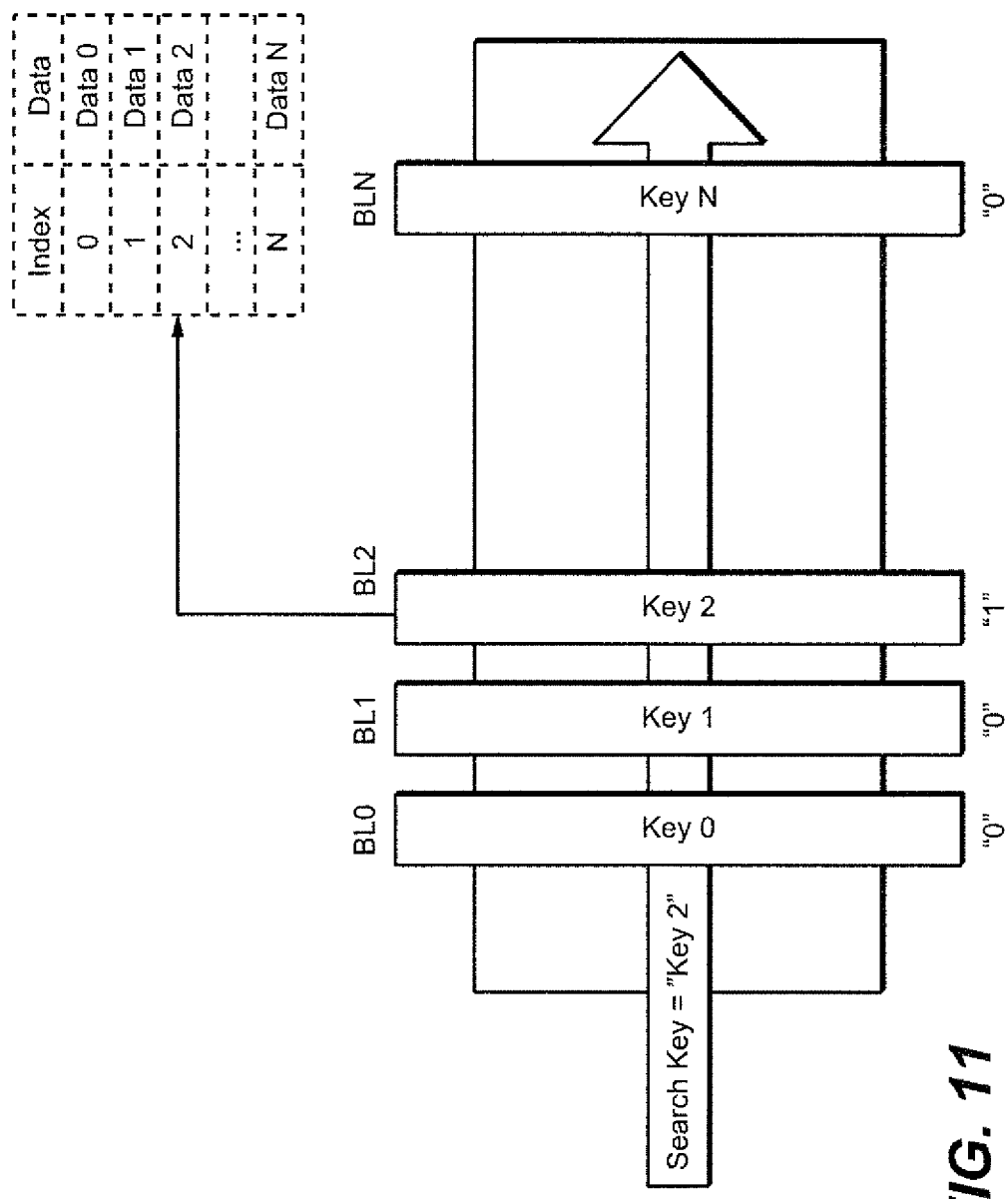
FIG. 11 illustrates how the position of a conducting bit line can be used as an index in to another table that can be used to retrieve data associated with the target key.

In FIG. 11, the bit lines BL0, BL1, . . . run down the columns of the array and are written with corresponding keys Key 0, Key 1, . . . as previously described. The word lines are then biased according to the search key (here Key 2) so that it is broad to all of the bit lines spanned by the word lines. When a matching key or keys are found, the column address of the bit line is then input as an index to find the data set, also stored on the drive. A number of arrangements are possible, where, for example, the keys could be stored in binary or MLC arrays optimized for CAM use, while the data is stored in more standard MLC arrays.

A drive using such a mechanism can then be used to search for key-value pairs in a large search space, perform general pattern matching (using bloom filters), or be used for determining set membership. Some of the advantages of a drive using such a scheme include low power usage and high bandwidth. As data does not need to be moved from the NAND array to a separate computational module for comparison, power consumed on IO operations is reduced. Furthermore, since only bit lines that match a given search pattern will conduct, the NAND comparison operation is also low power. With respect to bandwidth, a single NAND die is capable of doing, say, 256K 64-bit comparisons in under 50 us, working out to under 200 ps per comparison. Additionally, multiple die can be operated in parallel to increase bandwidth or to increase the effective key-length. Potentially 8 Gb (~8 G keys) of 64-bit keys can be searched in ~100 ms in a single die based on current design.

Figure 12:
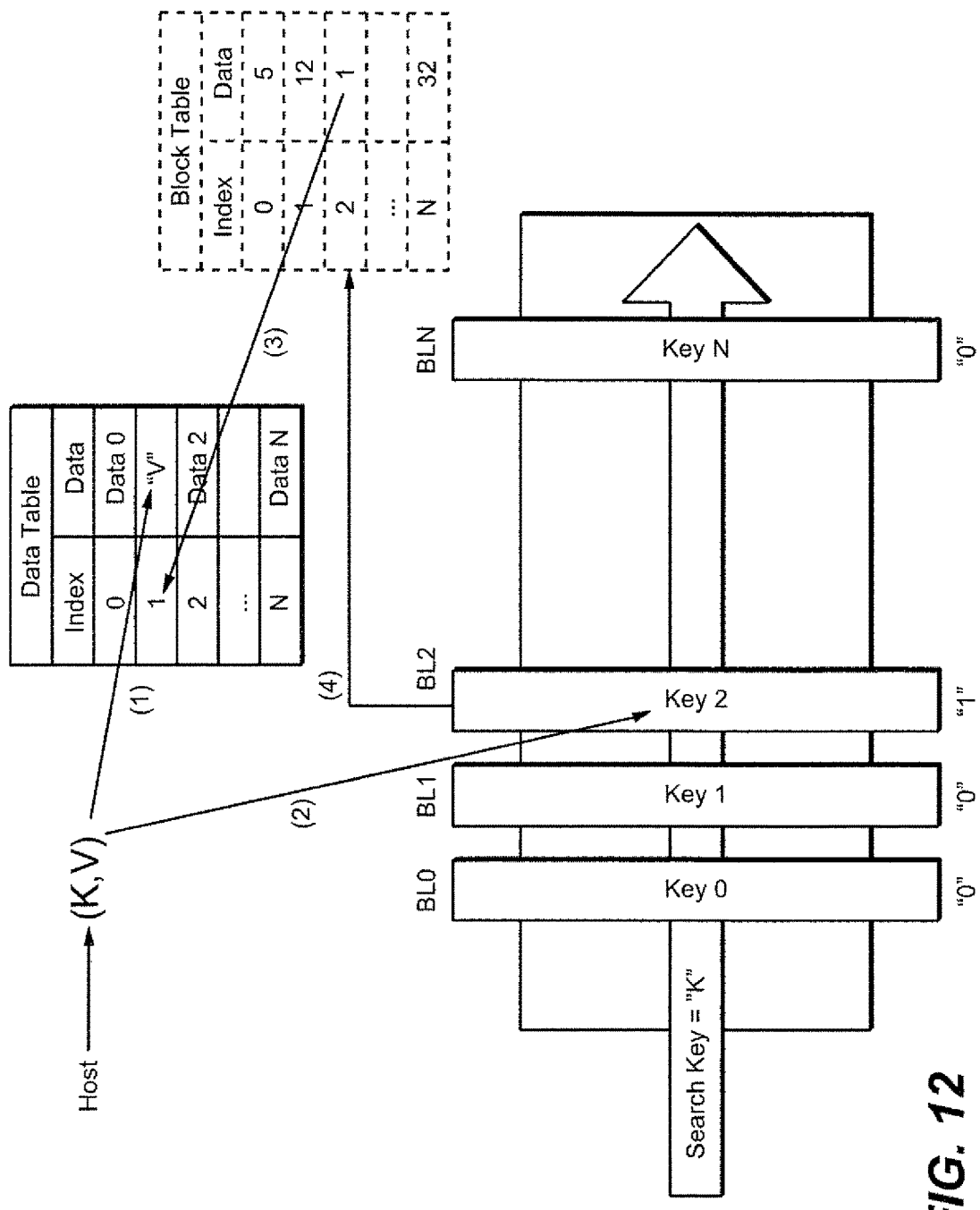
FIG. 12 schematically illustrates how a key-value pair is stored in a NAND based CAM and how the value is accessed using the key.

The idea of using a storage drive with a common interface, such as SAS, PCI-E, SATA, and so on, but which is written using key-value pairs instead of a conventional logical addressing is consider further with respect to FIG. 12. In the write method, the host will write Key-Value pair (K, V) to the drive. The drive will store the Value V in a data store at some address in the Data table of FIG. 12, as illustrate at (1), The drive will store the key value K on a bit line "i" in a block of an array of the drive, as shown at (2) of FIG. 12. The drive will make an entry in the block table at address i, with a pointer to the value V, as shown at (3). The column address which has the matching key can be output from NAND memory from status bits.

In NAND flash memory, data is written in word line based pages. Because of this, as previously discussed, the keys may be initially written along word lines, then rearranged to be written along bit lines, or first stored in RAM and then sorted into bit lined oriented keys. (It could also be possible for the host to have already taken care of this bit line based orientation for the keys, although it will generally be preferable for this operation to be transparent as seen from outside of the drive, with a host just providing basic key-value pairs and not having to engage in such data manipulations.) The controller will take care of assigning the keys and values to physical addresses and of determining the needed addressing structures to translate the key into the corresponding data location. The key to value mapping tables can be maintained in much the same way as the usual logical to physical mapping tables as far storing them and updating them, such as mappings using look up tables or based a correspondence formula. For example, the column address can be mapped to metadata in the primary storage flash management layers.

In a variation, if the drive itself has a key generating ability, such as a hashing algorithm using by the controller, just the data set itself could be sent to the drive and the corresponding keys generated on the drive. This would also allow a different host without the key generating ability to send data to the drive, where the key-value then be generated and stored. Under this sort of arrangement, for a host to access a value using a key, the host would need to use the same key generating algorithm (such as from a Secure Hash Algorithm (SHA), for example) as being used by the drive.

Looking now at the read process, the host will send the drive a key (K) that is then used to search key blocks. As discussed in the previous section, the key blocks may be sorted, in which case a binary search can be used; or they can be unsorted, in which case a linear search is used. For each key block, the drive will apply the key K to the word lines. If a matching key exists along a bit line in the block, NAND flash will register a "1" at the bit position "j" associated with the matching key. The value "j" can then be used as an index to the associated block table, as represented at (4) in FIG. 12, to retrieve a pointer, (3), to the associated value V in the Data Table. If all key blocks are searched without finding a match, the drive can return an "element not found status" or error.

The CAM NAND can be incorporate into the same memory system as that in which the associated data is stored, such as an SSD, in which case the data corresponding to the search key can be provided directly to the host. In other embodiments, the CAM NAND could be a separate device used to provide the sort of CAM-based operations described here, while the associated data could be stored separately, in which case as address or other pointer to the corresponding data on the separated device would be provided.

Consequently, storage drive can benefit by use of the inherent "AND" functionality available in a NAND Flash memory to compare thousands of keys in a single sensing operation. A storage drive of this type has several major advantages over traditional CPU- or semiconductor-based CAM memories. First, because the key comparison is done "on die", there is no need to transfer the data out of the memory. This saves both time and IO Power. Furthermore the actual comparison operations use less power than conventional memories.

In addition to the low power and high bandwidth advantages discussed in more detail earlier, this scheme has the advantage that write times can be shorter if data is searched in a linear mode. Most databases spend time and energy sorting and maintaining tables to enable fast, binary type, search capability for when data is read. In one embodiment of this invention, the writes of data and keys can be done in a random fashion making writes times of O(1) complexity. Searches will use a linear search mechanism which is highly parallelized but is still O(N) complexity. This is less efficient than the O(LogN) of most binary searches and is a tradeoff between insertion time vs. lookup time. Also, it should be noted that even when data is stored in a sorted manner, the high degree of parallelism in searching mean that the sorting only needs to be done to the level at which the search is done, namely to the granularity of block or number of blocks searchable in parallel.

The sort of NAND flash base CAS drives can be applied to a number of applications, including those described in the previous section. One set of examples of these exemplary applications is for de-duplication using pattern matching (CAM) NAND to store the hash keys. Incoming data can be sent through the hash function to generate the content related fingerprints. The fingerprints can then be searched with the existing hash keys to see whether the data already exists in the data storage. If it does already exist, no write action is taken; but if the data does not yet exit, then the new data will be written into the storage. The de-duplication can be done when the data is backing up, during garbage collection operations of the primary storage, or in-line as the data comes in from host. Another application is for virtual memory management, which can be done similarly to de-duplication. The drive can also be applied to the Human Genome, where the drives stores signatures in the CAM NAND so that any segment of the DNA sequence can be searched. The drive also lends itself to parallel computing where, a mathematical NAND function can be done inside of the NAND memory.

As noted above, the CAM NAND operation has the keys oriented along bit line, whereas NAND memory written along word lines. Consequently, as the keys come in from a host, they need to be accumulated in a buffer memory of some sort, transposed to a bit line orientation, formed into pages (including adding any inverse keys as needed), and transferred to the NAND device for writing. This is illustrated schematically in FIG. 13.

Figure 13:
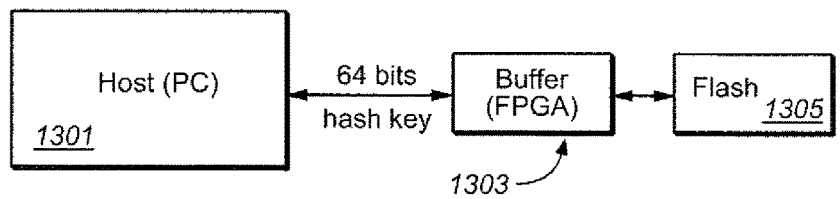
FIG. 13 illustrates a memory arrangement for transposing the data keys.
Figure 14:
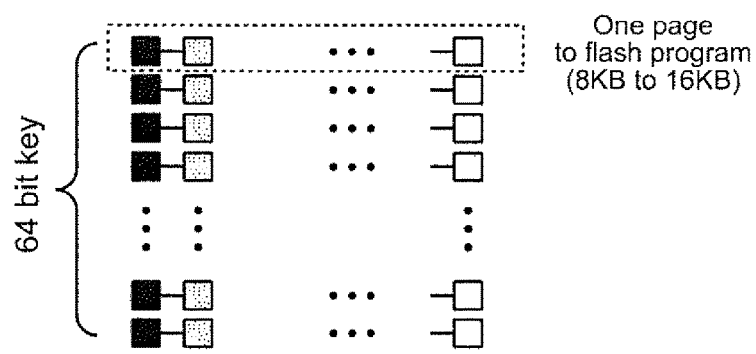
FIG. 14 represents a first hardware embodiment for transposing data using a FIFO-type structure.
Figure 15:
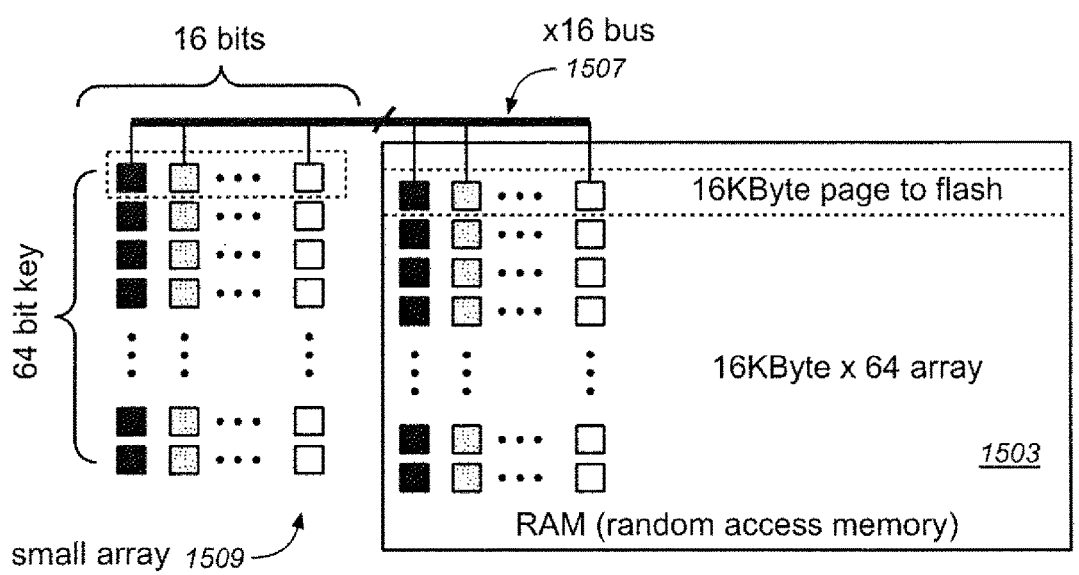
FIG. 15 represents another hardware embodiment for transposing data.

As shown in FIG. 13, a host 1301 (a PC, for example) can take the data files and generate the corresponding keys, such as using a Secure Hash Algorithm (SHA) to generate a 64 bit hash key, which can then be transferred over to a buffer memory 1303 on the memory system, where the keys can be accumulated. The transposing buffer memory 1303 is used to align the keys for writing in the NAND CAM memory 1305. Once a sufficient number of keys, say 4 MB keys for a NAND memory 1305 with 4 MB blocks, the data can be transferred over for programming as pages along the word lines. FIGS. 14 and 15 give some examples of hardware implementations for the transposing buffer memory, but this can be implemented in various other ways, such as by use of a field programmable gate array (FPGA). For example, a blocks worth of keys could be accumulated in an FPGA and then read out a word line at a time and transferred over to the CAM NAND for writing.

FIG. 14 is a schematic illustration of a hardware implementation of the transposing memory in FIFO style. The data can come in as, say, 64 bits keys or indices and is saved in column-oriented 64 bits registers. The registers are chained into a FIFO arrangement so that when a new key comes in, the previous keys shift over by one column to the right. Once there are enough keys for one page (i.e., 8 KB to 16 KB for a typical design) to be programmed into the CAM NAND memory (or early, if smaller number of keys are to be used), the pages are shifted over to the NAND for programming into the array there. Under this arrangement, if desired, the keys may be searched while still in the FIFO before being programmed, as the keys can be shifted out one at a time for comparison.

FIG. 15 is a schematic illustration of another hardware implementation for transposing the data keys using more of a RAM style arrangement. The data can come in as, for example, 64 bit keys or indices and be saved in 64 bits registers, being accumulated in a relatively small, 16×64 array 1509 in latches. The 16×64 bits of the small array 1509 can then be shifted over a bus 1507 a word (16 bits) at a time into the RAM 1503. After shifting the 64 words into RAM, the small array 1509 can accumulate next 16×64 bits. This process can continue until the RAM 1503 is full or it is otherwise desired to write in the keys, at which point is programmed in the CAM NAND memory. Under the arrangement of FIG. 15, if it is desired to search the keys before they are written into the CAM NAND, another RAM buffer storing the keys without transpose can be kept for this search purpose.

Conclusion

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated.

It is claimed:

1. An apparatus, comprising:
   a memory block comprising a plurality of bit lines and a plurality of word lines, the memory block further comprising a plurality of NAND strings, each NAND string comprising a series of non-volatile memory cells coupled to a same one of the bit lines, and a plurality of NAND pages, each NAND page comprising non-volatile memory cells of respective NAND strings coupled to a same one of the word lines of the memory block; and
   control circuitry configured to:
      buffer a plurality of data keys for storage within the memory block in a first orientation, the first orientation arranging the data keys for storage within respective NAND pages of the memory block, and
      perform a plurality of write operations to store the data keys in a second orientation different from the first orientation, the second orientation arranging the data keys for storage along respective NAND strings of the memory block,
   wherein each write operation comprises storing data within one of the plurality of NAND pages of the memory block, the data stored in each write operation comprising data bits of each data key, such that the data bits of each data key stored within the plurality of NAND pages are aligned along the respective NAND strings of the memory block and the series of non-volatile memory cells of each of the respective NAND strings store data bits of a selected one of the plurality of data keys and exclude data bits of data keys other than the selected data key,
   wherein the control circuitry is further configured to identify a NAND string storing a data key that matches a search pattern in response to a sense operation, comprising sensing the identified NAND string while the search pattern is applied to the word lines of the memory block.

2. The apparatus of claim 1, wherein the control circuitry is configured to buffer the data keys in a volatile memory.

3. The apparatus of claim 1, wherein the control circuitry is further configured to generate a data key of the plurality of data keys, the generated data key comprising one or more of a hash value, a hash code, and a signature of a data value.

4. The apparatus of claim 1, wherein:
   the control circuitry comprises a table to map data keys stored within the memory block to storage addresses of corresponding data values, and
   the control circuitry is further configured to determine a storage address for the search pattern by use of the table and in response to identifying the NAND string that matches the search pattern in the sense operation.

5. The apparatus of claim 4, wherein:
   each data key comprises key data,
   the control circuitry is further configured to generate inverted key data for each of the data keys, and store the key data and the inverted key data of each data key within respective NAND strings of the memory block, and
   the sense operation comprises sensing electrical characteristics of one or more of the NAND strings of the memory block while word lines of the memory block are driven in accordance with one or more of the search pattern and an inverted version of the search pattern.

6. The apparatus of claim 5, wherein the control circuitry is further configured to store the key data and the inverted key data of each data key within respective NAND strings of the memory block and to identify the NAND string storing the data key that matches the search pattern in response to sensing the matching NAND string while first word lines coupled to non-volatile memory cells storing key data of the data keys are driven in accordance with the search pattern, and second word lines coupled to non-volatile memory cells storing inverted key data of the data keys are driven in accordance with an inverted version of the search pattern.

7. The apparatus of claim 6, wherein the control circuitry is further configured to store data keys within the memory block such that the key data and the inverted key data of each data key are interleaved within respective NAND strings.

8. The apparatus of claim 5, wherein:
the control circuitry is further configured to store the key data and the inverted key data of each data key within different respective NAND strings of the memory block,
identifying the matching NAND string comprises identifying a first matching NAND string in a first sense operation and identifying a second matching NAND string in a second sense operation,
the first sense operation comprises applying the search pattern to the word lines of the memory block, and
the second sense operation comprises applying an inverted version of the search pattern to the word lines of the memory block.

9. The apparatus of claim 1, wherein the control circuitry is further configured to:
buffer the data keys in non-volatile storage; and
transpose the buffered data keys into the second orientation in response to reading the data keys from the non-volatile storage.

10. The apparatus of claim 1, further comprising a first-in-first-out (FIFO) circuit comprising a plurality of registers, wherein the control circuitry is further configured to buffer the data keys within the registers of the FIFO such that the data keys are buffered within the first orientation and are read out from registers of the FIFO in the second orientation.

11. The apparatus of claim 1, wherein the memory block comprises an array of non-volatile memory cells having a 3D-type architecture.

12. An apparatus, comprising:
a controller configured to store data keys within a memory array comprising a plurality of bit lines, each bit line coupled to a series of non-volatile memory cells, each non-volatile memory cell coupled to one of a plurality of word lines, wherein storing the data keys comprises:
storing the data keys in a plurality of write operations, the plurality of write operations comprising transposing the data keys from a word line orientation to a bit line orientation, the word line orientation arranging data bits of respective data keys for storage along respective word lines of the memory block, and the bit line orientation arranging the data bits of the respective data keys for storage along respective bit lines of the memory block, each write operation comprising storing a data bit of each data key along one of the plurality of word lines of the memory array such that the data bits of each data key are stored along the respective bit lines of the memory block in the plurality of write operations;
wherein the controller is further configured to determine whether a data key matching a search key is stored within the memory array, the determining comprising sensing the bit lines of the memory array while the word lines of the memory array are driven in accordance with the search key.

13. The apparatus of claim 12, further comprising:
a table configured to map data keys to storage addresses of corresponding data values, wherein the search key is specified in a read request, and wherein the controller is further configured to return a data set stored at a storage address associated with a data key stored along an identified bit line of the memory array, the bit line identified in response to sensing the particular bit line while the word lines of the memory array are driven in accordance with the search key.

14. The apparatus of claim 12, wherein the memory system comprises a solid-state memory device.

15. The apparatus of claim 13, wherein the controller is further configured to write data values corresponding to the data keys, wherein writing a data value corresponding to a first data key comprises:
writing the data value to a designated storage address; and
updating the table to map the first data key to the designated storage address.

16. The apparatus of claim 15, wherein the memory array is embodied within a first memory, and the designated storage address corresponds to a second memory, separate from the first memory.

17. The apparatus of claim 12, wherein the memory array is embodied in a memory having a 3D-type architecture.

18. A memory system, comprising:
a buffer memory;
a memory array comprising a plurality of NAND chains, each of the NAND chains comprising a series of memory cells, each memory cell coupled to one of a plurality of word lines; and
control circuitry configured to:
accumulate data keys in the buffer memory in a first arrangement, the first arrangement configured to map bit values of respective data keys to a plurality of different NAND chains of the memory array,
store the data keys within the memory array in accordance with a second arrangement, the second arrangement configured to map the bit values of each respective data key to respective NAND chains of the memory array, wherein storing the data keys comprises performing a plurality of write operations, each write operation to store a bit value of each data key along one of the plurality of word lines, the plurality of write operations configured such that the bit values of each data key are stored along the respective NAND chains, and each of the respective NAND chains stores bit values of one of the data keys and excludes bit values of others of the plurality of data keys,
wherein the control circuitry is further configured to identify a NAND chain that matches a search key in response to a parallel sense operation, the parallel sense comprising sensing the respective NAND chains of the memory array while voltage potentials on the plurality of word lines are driven in accordance with the search pattern.

19. The memory system of claim 18, wherein the controller is further configured to store the data keys within the respective NAND chains of the memory array in accordance with a sorted order of the data keys.

20. The memory system of claim 19, wherein the sense operation further comprises determining that the identified NAND chain is in a conductive state while the voltage potentials on the plurality of word lines are driven in accordance with the search key.

21. The memory system of claim 18, wherein the memory array comprises an array of non-volatile memory cells in a 3D-type architecture.

22. A system, comprising:
a memory comprising a plurality of NAND strings, each NAND string comprising memory cells arranged in series along a bit line, each memory cell coupled to a respective one of a plurality of word lines;

a FIFO comprising a plurality of registers;

a control circuit configured to:

buffer a plurality of data keys within the FIFO in word line orientation corresponding to storage of bit values of respective data keys along respective word lines of the memory, transfer the plurality of data keys from the FIFO to the memory in a plurality of write operations, the write operations comprising:

transposing the data keys to a bit line orientation, the bit line orientation corresponding to storage of the bit values of the respective data keys along respective bit lines of the memory, wherein each write operation comprises storing bit values of each of the respective data keys along a selected one of the word lines, wherein the plurality of write operations comprises storing the bit values of the respective data keys along the respective bit lines of the memory such that the memory cells of each NAND string of the respective NAND strings store data bits that correspond to one of the plurality of data keys and exclude data keys that correspond to others of the plurality of data keys, wherein the control circuit is further configured to identify a NAND string storing a data key that matches a search pattern in response to performing a sense operation, comprising:

applying the search pattern to the plurality of word lines, and sensing the respective NAND strings storing the bit values of the respective data keys in parallel.

23. The system of claim 22, wherein:

the search pattern corresponds to a request to access one of a plurality of data values, and the control circuit is further configured to determine a memory address corresponding to the data value in response to identifying the NAND string storing the data key that matches the search pattern in the sense operation.

24. The system of claim 23, further comprising a mapping table configured to translate data keys to memory locations of respective data values of the plurality of data values, wherein the control circuit is configured to determine the memory address of the data value within the mapping table by use of an index of the identified NAND string.

* * * * *